US011900995B2

(12) United States Patent
Sisodia et al.

(10) Patent No.: US 11,900,995 B2
(45) Date of Patent: Feb. 13, 2024

(54) WORDLINE MODULATION TECHNIQUES

(71) Applicant: Arm Limited, Cambridge (GB)

(72) Inventors: Rajiv Kumar Sisodia, Bangalore (IN); Andy Wangkun Chen, Austin, TX (US); Sriram Thyagarajan, Austin, TX (US); Yew Keong Chong, Austin, TX (US); Ayush Kulshrestha, New Delhi (IN); Munish Kumar, Noida (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/223,950

(22) Filed: Apr. 6, 2021

(65) Prior Publication Data

US 2022/0319586 A1   Oct. 6, 2022

(51) Int. Cl.
*G11C 11/419* (2006.01)
*G11C 11/418* (2006.01)
*G11C 11/412* (2006.01)

(52) U.S. Cl.
CPC .......... *G11C 11/418* (2013.01); *G11C 11/412* (2013.01); *G11C 11/419* (2013.01)

(58) Field of Classification Search
CPC .... G11C 11/418; G11C 11/419; G11C 11/412

USPC ........................................................ 365/154
See application file for complete search history.

(56) References Cited

U.S. PATENT DOCUMENTS

| 9,018,980 | B1* | 4/2015 | Durairajan | G06F 1/08 |
| | | | | 326/38 |
| 9,324,392 | B1* | 4/2016 | Asenov | G11C 7/12 |
| 9,928,889 | B1* | 3/2018 | Narasimhan | G11C 7/1075 |
| 11,250,895 | B1* | 2/2022 | Sheth | G11C 7/1087 |
| 2008/0298143 | A1* | 12/2008 | Chen | G11C 7/22 |
| | | | | 365/194 |
| 2010/0250865 | A1* | 9/2010 | Rao | G11C 7/227 |
| | | | | 711/149 |
| 2019/0392876 | A1* | 12/2019 | Katoch | G11C 7/22 |
| 2022/0068360 | A1* | 3/2022 | Pallerla | G11C 7/1075 |
| 2022/0199153 | A1* | 6/2022 | Nagata | G11C 11/418 |

\* cited by examiner

*Primary Examiner* — Sung Il Cho
(74) *Attorney, Agent, or Firm* — Pramudji Law Group PLLC; Ari Pramudji

(57) ABSTRACT

Various implementations described herein are related to a method for accessing a bitcell in an array of bitcells with a wordline and a bitline. The method may perform a precharge operation on the bitline that precharges the bitline after a read cycle and before a write cycle. Also, the method may extend precharge time of the precharge operation between the read cycle and the write cycle, e.g., by modulating a wordline signal on the wordline with early cut-off of the wordline signal on the wordline during the read cycle.

20 Claims, 7 Drawing Sheets

700

710 — provide first circuitry that is configured to access a bitcell in an array of bitcells with a wordline and a bitline 720 — provide second circuitry that is configured to perform a precharge operation on the bitline that precharges the bitline after a read cycle and before a write cycle 730 — provide third circuitry that is configured to extend precharge time of the precharge operation between the read cycle and the write cycle by modulating a wordline signal on the wordline with early cut-off of the wordline signal on the wordline during the read cycle

FIG. 7

WORDLINE MODULATION TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit designs, conventional memory access devices may use a multiplexer and a latch at multi-port based inputs so as to select between multiple input ports while performing read/write operations. In some situations, the multiple input ports of the memory access devices may refer to a single read port and a single write port that are accessible with use of a double-pulse clock signal. This double-pulse timing operation may refer to a read operation followed by a write operation, and when the read operation is completed, the write-port data may enter the memory device. Also, with arrival of the second timing pulse, the write operation is completed. In some situations, timing pulses of the read/write operations may be similar to a single-port design. Unfortunately, in some conventional memory designs, the separation time between the read/write operations may adversely impact the memory performance, which is typically limited by bitline precharging before the write wordline is enabled. There exists a need to improve memory designs so as to provide highly efficient performance features and characteristics.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 6-7 illustrate diagrams of methods for providing memory architecture in accordance with various implementations described herein.

DETAILED DESCRIPTION

Various implementations described herein are directed to wordline modulating schemes and techniques for memory applications in physical circuit designs. The various schemes and techniques described herein may provide for high-speed low-power pseudo dual-port memory designs by way of implementing cycle-stealing. For instance, in pseudo dual-port architecture designs, the separation between the two global timing pulse (GTP) clock pulses needed for critical margins may impact memory performance. As such, the various schemes and techniques described herein may be used to improve performance by minimizing the separation time, e.g., by cycle-stealing time from read cycles and write cycles. In some situations, the separation time may be limited by bitline precharge and/or wordline overlap and/or internal address setup. Thus, various schemes and techniques described herein may be used to enable early bitline precharge and/or late wordline start so as to thereby optimize separation time and gain performance.

Various schemes and techniques described herein may improve performance by minimizing the separation time, wherein timing characteristics may be used to enable more precharge time in a short overall time duration with early wordline turn-off during the read cycle. This may provide for early bitline precharge. In addition, the various schemes and techniques described herein may utilize the aspect of the write operation being gated by bitline pull-down, wherein the write wordline is delayed. This wordline closure pull-in during the first pulse of the read cycle and during the wordline start delay in second pulse of the write cycle allows for more time to precharge the bitline and meet a race ratio margin within a short duration. Also, the pulse-to-pulse separation timing may be reduced, which may improve performance by using schemes and techniques described herein.

The memory architecture may refer to various volatile memory and non-volatile memory, such as, e.g., static random access memory (SRAM) and/or magneto-resistive random access memory (MRAM). The memory architecture may include memory circuitry having a core array of memory cells or bitcells that are accessible via data access lines, such as one or more wordlines and bitlines. In SRAM applications, data access lines refer to complementary bit-lines (BL, NBL), and in MRAM applications, data access lines refer to at least one bitline (BL) and at least one source line (SL).

Various implementations of wordline modulating schemes and techniques for memory applications will be described herein with reference to FIGS. 1-7.

Figure 1:
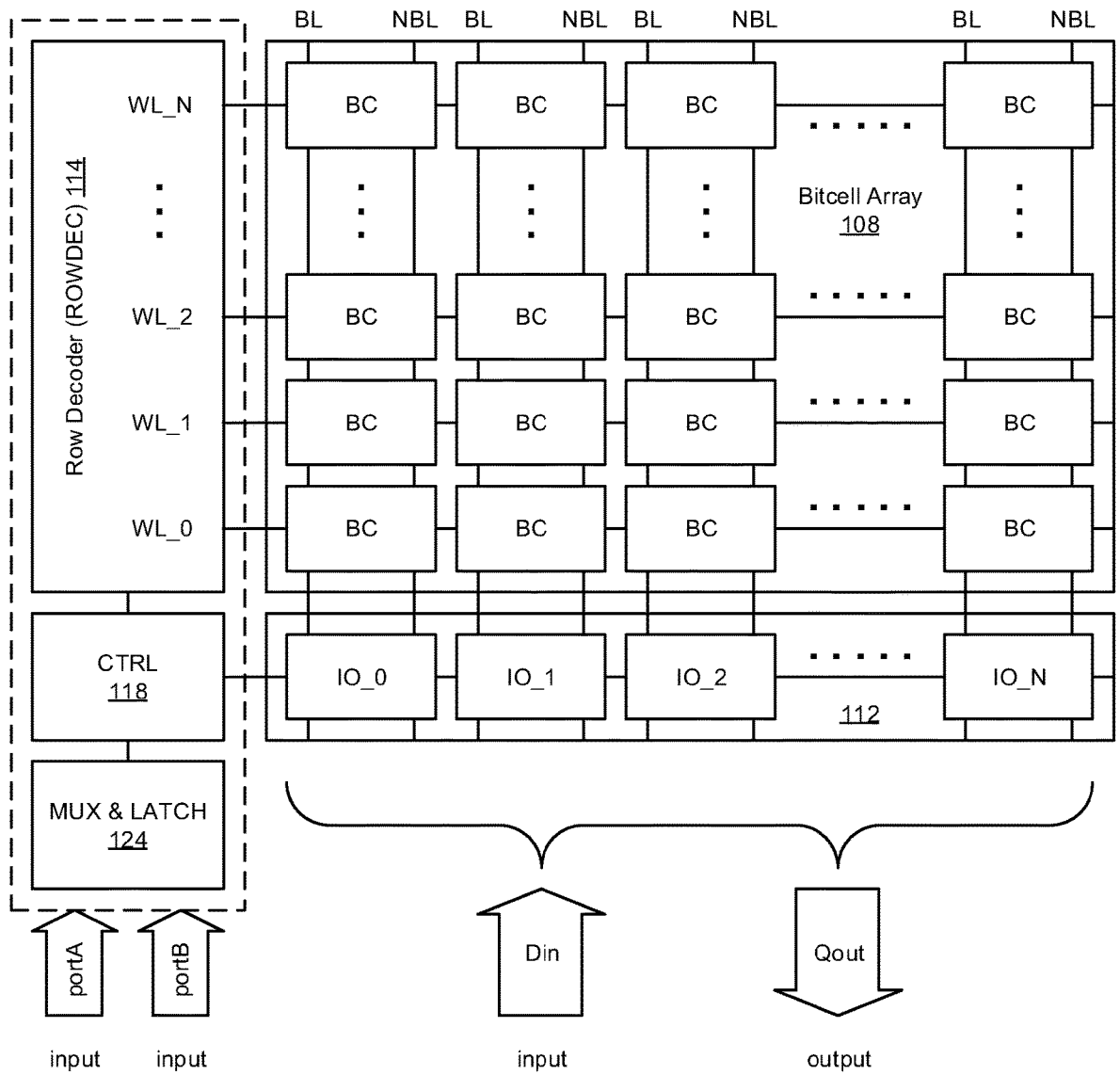
FIG. 1 illustrates a schematic diagram of memory architecture in accordance with various implementations described herein.

FIG. 1 illustrates a diagram 100 of memory architecture 104 in accordance with various implementations described herein. In various implementations, the memory architecture 104 may be referred to as pseudo dual-port memory architecture that may be used as a device for implementing wordline modulation (WLM) techniques.

In various implementations, the memory architecture 104 may be implemented as a system or device having various integrated circuit (IC) components that are arranged and coupled together as an assemblage or combination of parts that provide for physical circuit designs and various related structures. In some instances, a method of designing, building, and fabricating the memory architecture 104 as an integrated system or device may involve use of the various IC circuit components described herein so as to implement wordline modulating schemes and techniques associated therewith. Further, the memory architecture 104 may be integrated with computing circuitry and related components on a single chip, and the memory architecture 104 may be implemented in embedded systems for automotive, electronic, mobile, server and Internet-of-things (IoT) applications.

As shown in FIG. 1, the memory architecture 104 has various components including, e.g., core bitcell array circuitry 108, input-output (IO) circuitry 112, row decoder (ROWDEC) circuitry 114, control circuitry 118, and multiplexer/latch circuitry 124. In some implementations, the core bitcell array circuitry 108 may have an array of memory cells or bitcells (BC) that are arranged in columns and rows and that are accessible via multiple wordlines (WL_0, WL_1, WL_2, . . . , WL_N) for each row and multiple bitlines (BL, NBL) for each column. The input-output (IO) circuitry 112 may have corresponding IO circuitry (IO_0, IO_1, IO_2, . . . , IO_N) for each set of bitlines (BL/NBL). The row decoder circuitry (ROWDEC) 114 may be configured to provide wordline access signals to corresponding bitcells (BC) for each row of wordlines (WL_0, WL_1, WL_2, . . . , WL_N). Also, the control (CTRL) circuitry 118 may be coupled to the row decoder circuitry (ROWDEC) 114 and the input-output (IO) circuitry 112, and the multiplexer/latch (MUX & LATCH) circuitry 124 may be coupled to the control (CTRL) circuitry 124.

In some implementations, the pseudo dual-port memory architecture 104 may have at least two input ports (e.g., dual-ports: portA, portB) coupled to the multiplexer/latch (MUX & LATCH) circuitry 124. Also, a data input port (Din) provides data input to the core bitcell array circuitry 108 via the IO circuitry 112, and a data output port (Qout) provides data output from the core bitcell array circuitry 108 via the IO circuitry 112.

The memory architecture 104 may be implemented as an integrated circuit (IC) in using various types of memory, such as, e.g., random access memory (RAM), including static RAM (SRAM), magneto-resistive RAM (MRAM), and/or any other type of similar memory. The memory architecture 104 may be implemented as an integrated circuit (IC) with dual rail memory architecture and any related circuitry. The memory architecture 104 may be integrated with computing circuitry and related components on a single chip. Also, the memory architecture 104 may be implemented in embedded systems for electronic, mobile and Internet-of-things (IoT) applications, including low power sensor nodes.

As shown in FIG. 1, the memory architecture 104 may have the core bitcell array circuitry 108 that has an array of memory cells, wherein each memory cell may be referred to as a bitcell (BC). Also, each memory cell (or bitcell) may be configured to store at least one data bit value (e.g., a data value related to a logical '0' or '1'). The array of memory cells may include any number (N) of memory cells (or bitcells) arranged in various applicable configurations, such as, e.g., a two-dimensional (2D) memory array having any number (N) of columns (N_columns) and any number (N) of rows (N_rows) with memory cells arranged in a 2D grid pattern with associated indexing capabilities.

In various implementations, the memory architecture 104 may include volatile or non-volatile memory bitcell structures, such as, e.g., static random access memory (SRAM) bitcell structures or a magneto-resistive random access memory (MRAM) bitcell structures. In some instances, the bitcell structures may be configured with 1T1R MRAM bitcells having one transistor component (1T) and one resistor component (1R). In some instances, the transistor (T) may refer to an N-type MOS (NMOS) transistor, and also, the resistor (R) may refer to a magnetic based resistor having a magnetic tunneling junction (MTJ) interposed between a pinned layer (PL) and a free layer (FL). In reference to MTJ MRAM bitcells, data is stored with magnetic storage elements that are formed from two ferromagnetic plates (PL, FL) separated by a thin insulating layer (MTJ). The pinned layer (PL) may refer to a permanently magnetized plate having a set polarity, and the free layer (FL) may refer to a selectively magnetized plate having a selectively changeable polarity that matches or is opposite to the polarity of the pinned layer (PL). Also, when sensing for resistance, the aligned polarities may provide lower resistance for representing a first readable logical data state, and the opposing polarities may provide higher resistance for a second readable logical data state. As such, a logical zero (0) or a logical one (1) may be stored in the MTJ MRAM bitcell, e.g., based on a sensed resistance level through the MTJ MRAM bitcell. Moreover, for data access, each bitcell may include a wordline (WL), and in MRAM, the bitlines may be implemented with a bitline (BL) and a source line (SL). However, even though MTJ-MRAM bitcell structures may be used in the core bitcell array circuitry 108, any other type of bitcell (e.g., SRAM) may be used to achieve similar results of the wordline modulating schemes and techniques disclosed herein.

Figure 2:
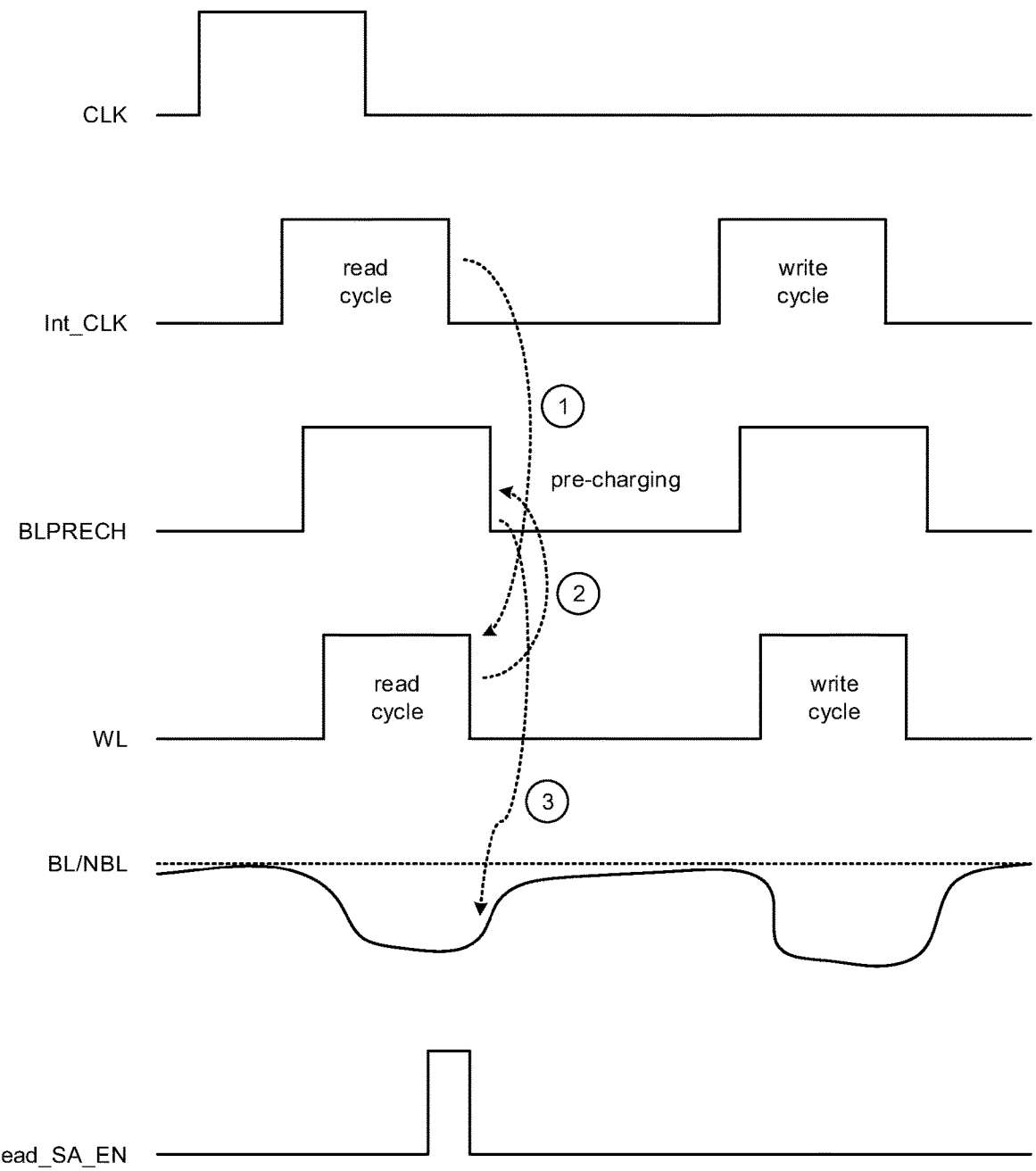
FIG. 2 illustrates a waveform diagram related to pseudo dual-port memory architecture in accordance with various implementations described herein.

FIG. 2 illustrates a diagram 200 of pseudo dual-port timing waveforms 204 in accordance with various implementations described herein. In various implementations, the pseudo dual-port timing waveforms 204 shown in diagram 200 of FIG. 2 is related to the pseudo dual-port memory architecture 104 shown in FIG. 1.

In some implementations, a clock pulse signal (CLK) may be used to trigger an internal clock pulse signal (Int_CLK) during a read cycle and a write cycle. Also, the clock pulse signal (CLK) may be used to trigger a bitline precharge signal (BLPRECH) that may provide for precharging the bitlines in between the read cycle and the write cycle. Also, the clock pulse signal (CLK) may trigger a wordline signal (WL) during the read cycle and the write cycle. For instance, as shown in FIG. 2, during the read cycle, the falling edge of the first pulse of the Int_CLK signal may trigger the falling edge of the first pulse of the WL signal. Also, during the read cycle, the falling edge of the first pulse of the WL signal may trigger the falling edge of the first pulse of the BLPRECH signal. Moreover, in some instances, during the read cycle, the falling edge of the first pulse of the BLPRECH signal may trigger the rising edge of the BL/NBL signal. Also, in some instances, the read sense amplifier enable signal (Read SA_EN) may be triggered during the read cycle.

In various implementations, in reference to FIG. 2, circled element 1 provides for early closing of the wordline in the read cycle, and also, circled element 2 provides for early enablement of the bitline precharge, as shown with circled element 3.

Figure 3:
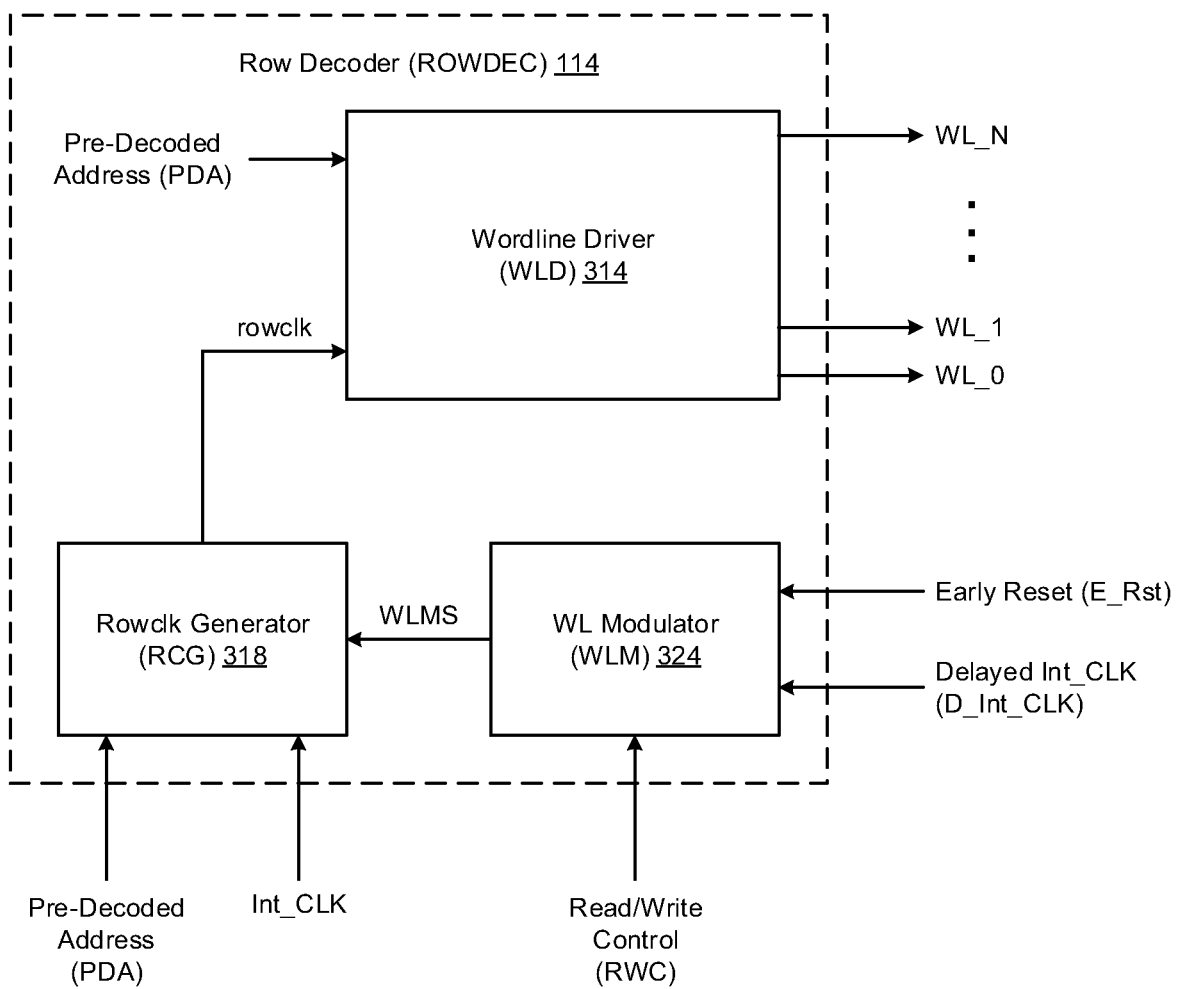
FIG. 3 illustrates a schematic diagram of wordline modulator architecture in accordance with various implementations described herein.

FIG. 3 illustrates a schematic diagram 300 of wordline modulator architecture 304 in accordance with implementations described herein. In some implementations, the wordline modulator (WLM) architecture 304 refers to pseudo dual-port wordline modulator (WLM) architecture that may be used as a device for implementing the various wordline modulation (WLM) schemes and techniques as described herein.

In various implementations, the WLM architecture 304 may be implemented as a system or device having various integrated circuit (IC) components that are arranged and coupled together as an assemblage or combination of parts that provide for physical circuit designs and various related structures. In some instances, a method of designing, building, and fabricating the WLM architecture 304 as an integrated system or device may involve use of the various IC circuit components described herein so as to implement wordline modulating schemes and techniques associated therewith. Further, the WLM architecture 304 may be integrated with computing circuitry and related components on a single chip, and the WLM architecture 304 may be implemented in embedded systems for automotive, electronic, mobile, server and Internet-of-things (IoT) applications.

As shown in FIG. 3, the wordline modulator (WLM) architecture 304 may have various circuitry and/or components including, e.g., wordline driver (WLD) 314, row clock generator (RCG) 318 and wordline modulator (WLM) 324, that may be arranged and configured to operate as the row decoder circuitry (ROWDEC) 114 of FIG. 1.

In some implementations, the row clock generator (RCG) 318 may be coupled between the wordline modulator (WLM) 324 and the wordline driver (WLD) 314. Also, the wordline modulator (WLM) 324 may receive various input signals, including, e.g., an early reset signal (E_Rst), a delayed internal clock signal (D_Int_CLK), and a read/write control signal (RWC). Also, the wordline modulator (WLM) 324 may output a wordline modulated signal (WLMS) based on the input signals (E_Rst, D_Int_CLK, RWC).

In some implementations, the row clock generator (RCG) 318 may receive the WLMS as an input signal along with a pre-decoded address signal (PDA) and the internal clock signal (Int_CLK) as various other input signals. Also, the row clock generator (RCG) 318 may then output a row clock signal (rowclk) to the wordline driver (WLD) 314 based on the input signals (WLMS, PDA, Int_CLK).

Also, in some implementations, the wordline driver (WLD) 314 may receive the rowclk signal as an input signal along with the PDA signal as another input signal. Further, the wordline driver (WLD) 314 may then output at least one wordline signal on a wordline (WL_0, WL_1, WL_2, ..., WL_N) based on the input signals (rowclk, PDA).

Figure 4:
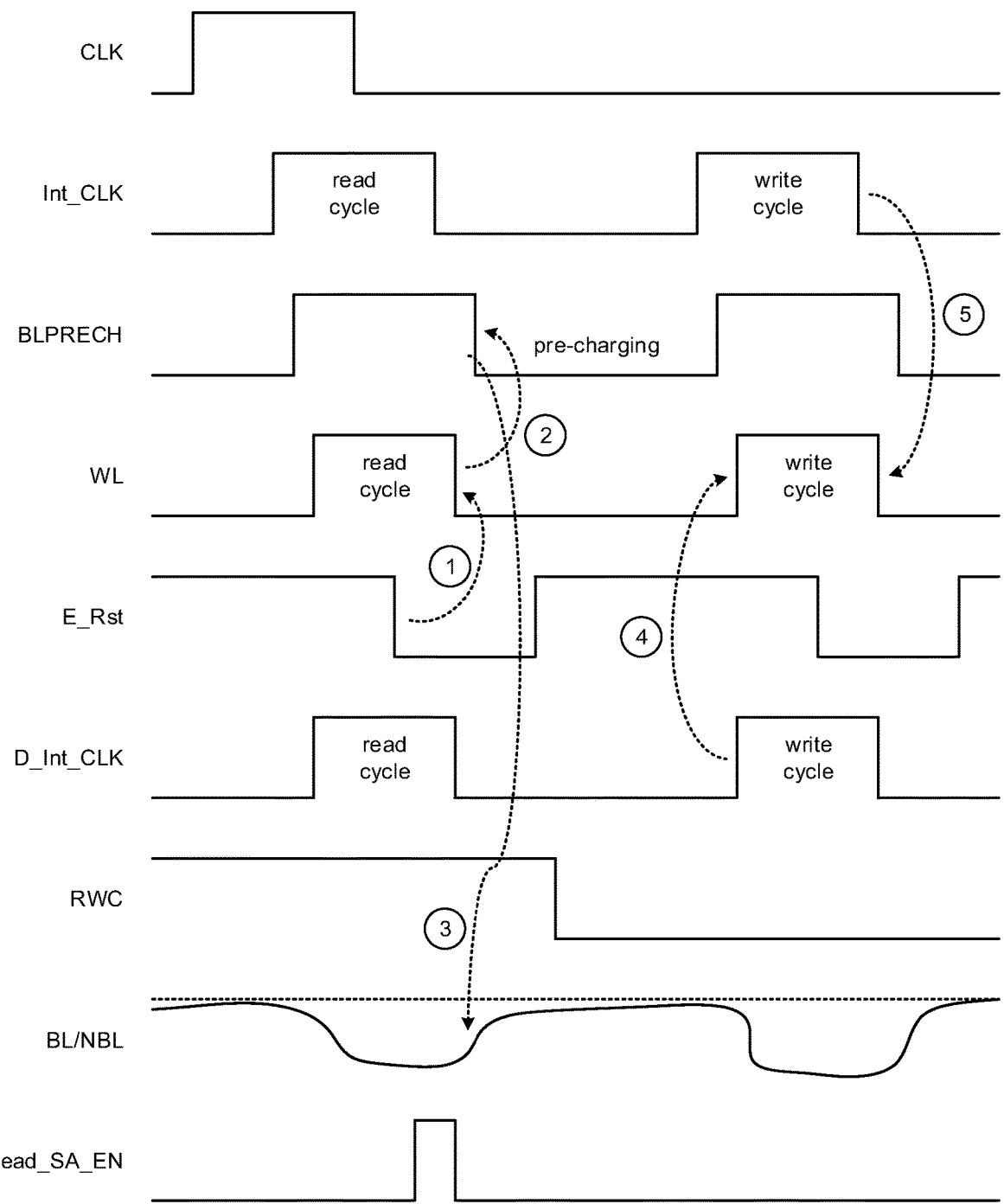
FIG. 4 illustrates a waveform diagram related wordline modulator architecture in accordance with various implementations described herein.

FIG. 4 illustrates a diagram 400 of pseudo dual-port timing waveforms 304 in accordance with various implementations described herein. In various implementations, the pseudo dual-port timing waveforms 404 shown in diagram 400 of FIG. 4 is related to the pseudo dual-port WLM architecture 304 shown in FIG. 3.

In some implementations, a clock pulse signal (CLK) may be used to trigger an internal clock pulse signal (Int_CLK) during a read cycle and a write cycle. Also, the clock pulse signal (CLK) may be used to trigger a bitline precharge signal (BLPRECH) that may provide for precharging the bitlines in between the read cycle and the write cycle. Also, the clock pulse signal (CLK) may trigger a wordline signal (WL) during the read cycle and the write cycle. Also, during the read cycle, the first pulse of the wordline (WL) signal may trigger the first pulse of the early reset signal (E_Rst), and also, during the write cycle, the second pulse of the wordline (WL) signal may trigger the second pulse of the early reset signal (E_Rst). Moreover, the clock pulse signal (CLK) may be used to trigger the delayed internal clock pulse signal (D_Int_CLK) during the read cycle and the write cycle. Further, the clock pulse signal (CLK) may be used to trigger the read/write control signal (RWC) between the read cycle and the write cycle.

In some instances, as shown in FIG. 4, the falling edge of the first inverted pulse of the E_Rst signal may be used to trigger the falling edge of the WL signal during the read cycle. Also, during the read cycle, the falling edge of the first pulse of the WL signal may trigger the falling edge of the first pulse of the BLPRECH signal. Also, during the read cycle, the falling edge of the first pulse of the BLPRECH signal may trigger the rising edge of the BL/NBL signal.

Also, in some instances, the read sense amplifier enable signal (Read SA_EN) may be triggered during the read cycle.

Also, in some instances, as shown in FIG. 4, during the write cycle, the rising edge of the second pulse of the D_Int_CLK signal may be used to trigger the rising edge of the second pulse of the WL signal. Moreover, during the write cycle, the falling edge of the second pulse of the Int_CLK signal may be used to trigger the falling edge of the second pulse of the WL signal.

In various implementations, in reference to FIG. 4, circled element 1 provides for early closing of the wordline in the read cycle, and also, circled element 2 provides for early enablement of the bitline precharge, as shown with circled element 3. Also, circled element 4 provides for delayed wordline rise in the write cycle, and also, circled element 5 provides for no early closing of the wordline in the write cycle.

In some implementations, in reference to FIGS. 3-4, the wordline driver (WLD) 314 may access a bitcell (BC) with a wordline (WL) and a bitline (BL/NBL), and also, the input-output (IO) circuitry 112 may be configured to perform a precharge operation on the bitline (BL/NBL) to precharge the bitline (BL/NBL) after a read cycle and before a write cycle. The wordline modulator (WLM) 324 that extends precharge time of the precharge operation between the read cycle and the write cycle by modulating a wordline signal on the wordline (WL) with early cut-off of the wordline signal on the wordline (WL) during the read cycle. The wordline modulator (WLM) 324 may extend precharge time by increasing the precharge time during a precharge cycle that occurs between the read cycle and the write cycle so as to thereby enhance the performance of accessing the bitcell (BC) during the overall operational time duration of the read cycle followed by the precharge cycle and the write cycle which reduces separation time. Also, the wordline modulator (WLM) 324 may extend the precharge time of the precharge operation by providing for early precharge of the bitline after the read cycle and before the write cycle.

Also, in some instances, the input-output (IO) circuitry 112 may be configured to perform a read operation before the precharge cycle and during the read cycle and also perform a write operation after the precharge cycle and during the write cycle. The write operation may be powergated by pull-down of the bitline (BL/NBL) to ground (Vss/Gnd) during the write cycle so as to delay the wordline signal on the wordline (WL). Also, the early cut-off of the wordline signal on the wordline (WL) during the read cycle along with the delay of the wordline signal on the wordline (WL) may also assist with extending the precharge time of the precharge operation so as to precharge the bitline faster and within a shorter duration. Also, in some instances, the bitcell refers to a six-transistor (6T) static random access memory (SRAM) bitcell.

Figure 5:
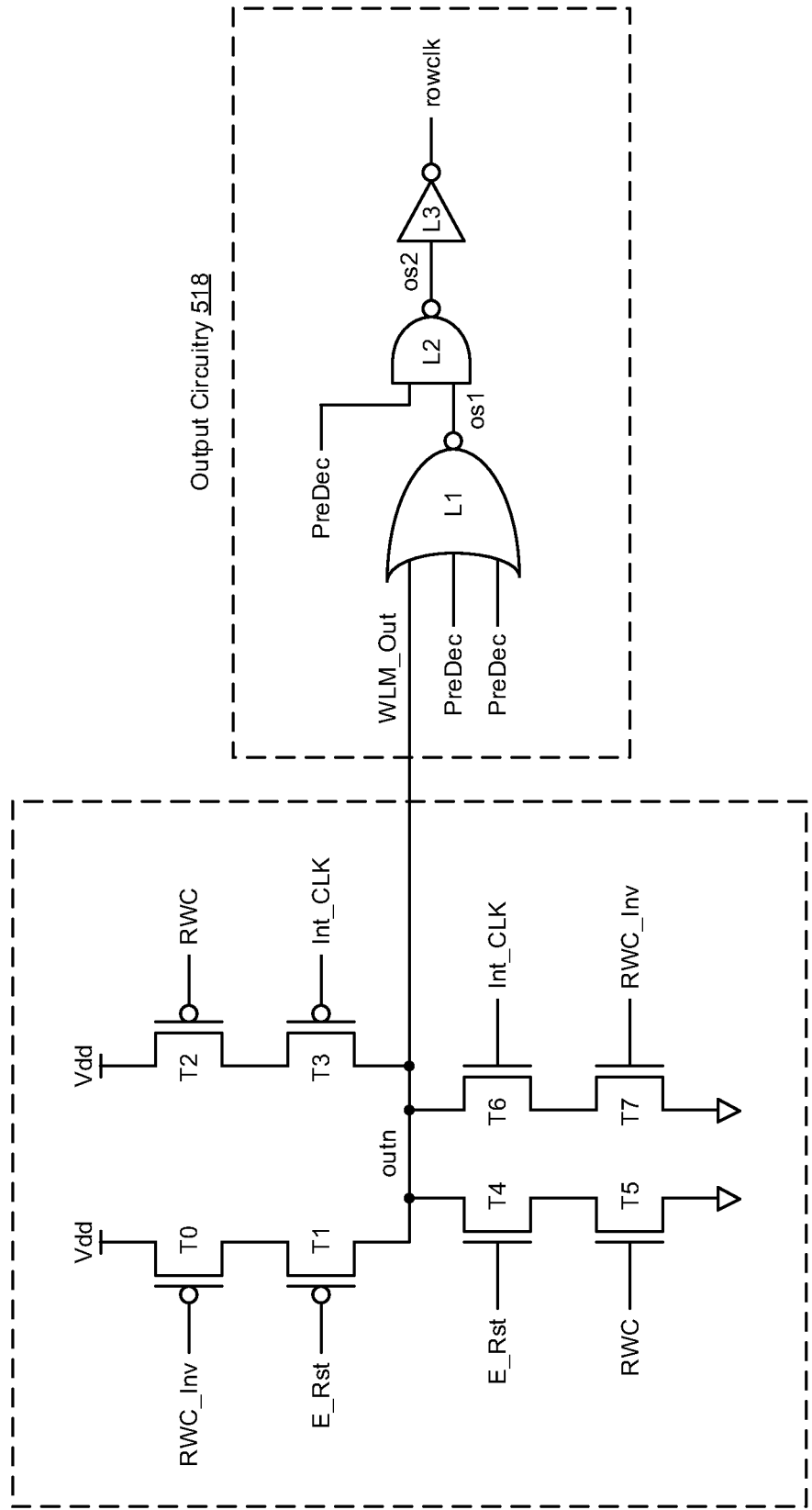
FIG. 5 illustrates a schematic diagram of wordline modulator architecture in accordance with various implementations described herein.

FIG. 5 illustrates a schematic diagram 500 of WLM architecture 504 that may be used in accordance with various implementations described herein. In this instance, the WLM architecture 504 is described herein as an example embodiment, and as such, various other configurations may be used to achieve similar logical behavior.

In various implementations, the WLM architecture 504 may be implemented as a system or device having various integrated circuit (IC) components that are arranged and coupled together as an assemblage or combination of parts that provide for physical circuit designs and various related structures. In some instances, a method of designing, building, and fabricating the WLM architecture 504 as an integrated system or device may involve use of the various IC circuit components described herein so as to implement wordline modulating schemes and techniques associated therewith. Further, the WLM architecture 504 may be integrated with computing circuitry and related components on a single chip, and the WLM architecture 504 may be implemented in embedded systems for automotive, electronic, mobile, server and Internet-of-things (IoT) applications.

As shown in FIG. 5, the wordline modulator (WLM) architecture 504 may have various circuitry and/or components including, e.g., wordline modulation (WLM) circuitry 508 and output circuitry 518, that may be arranged and configured so as to generate and provide the row clock signal (rowclk) as an output signal.

In some implementations, the WLM circuitry 508 may have various transistors (e.g., T0, T1, T2, T3, T4, T5, T6, T7, T8) that are arranged and coupled together between a source voltage supply (Vdd) and ground (Vss/Gnd). As shown, transistors (T0, T1) may be coupled in series between Vdd and an output node (outn), and also, transistors (T2, T3) may be coupled in series between Vdd and output node (outn). Moreover, transistors (T4, T5) may be coupled in series between output node (outn) and ground (Vss/Gnd), and also, transistors (T6, T7) may be coupled in series between output node (outn) and ground (Vss/Gnd). Also, output node (outn) provides a wordline modulation (WLM) output signal (WLM_Out) to the output circuitry 518.

In some instances, transistor (T0) may be coupled between Vdd and transistor (T1), and transistor (T0) is activated with an inverted read/write control signal (RWC_Int) that is coupled to its gate. Also, transistor (T1) may be coupled between transistor (T0) and output node (outn), and transistor (T1) may be activated with the early reset signal (E_Rst) that is coupled to its gate. Also, in some instances, transistor (T2) may be coupled between Vdd and transistor (T3), and transistor (T2) is activated with the read/write control signal (RWC) that is coupled to its gate. Also, transistor (T3) may be coupled between transistor (T2) and output node (outn), and also, transistor (T3) may be activated with the internal clock signal (Int_CLK) that is coupled to its gate. Transistors (T0, T1, T2, T3) may refer to P-type transistors; however, other configurations may be used.

In some instances, transistor (T4) may be coupled between output node (outn) and transistor (T5), and transistor (T4) may be activated with the early reset signal (E_Rst) that is coupled to its gate. Also, transistor (T5) may be coupled between transistor (T4) and ground (Vss/Gnd), and transistor (T5) may be activated with the RWC signal that is coupled to its gate. Further, in some instances, transistor (T6) may be coupled between output node (outn) and transistor (T7), and also, transistor (T6) may be activated with the Int_CLK signal that is coupled to its gate. Further, transistor (T7) may be coupled between transistor (T6) and ground (Vss/Gnd), and also, transistor (T7) may be activated with the RWC_Inv signal that is coupled to its gate. In various instances, transistors (T4, T5, T6, T7) may refer to N-type transistors; however, other configurations may be used.

In some implementations, the output circuitry 518 may have various logic gates (e.g., L1, L2, L3) that are arranged and coupled together to the output node (outn) of the WLM circuitry 508 so as to provide the rowclk output signal. As shown, the logic gate (L1) may receive input signals (WLM_Out, PreDec) and provide an output signal (os1) to the logic gate (L2). In some instances, the logic gate (L1) may refer to a 3-input NOR gate. Also, as shown, the logic gate (L2) may receive input signals (os1, PreDec) and provide an output signal (os2) to logic gate (L3). In some instances, the logic gate (L2) may refer to a 2-input NAND gate. Also, as shown, the logic gate (L3) may refer to an inverter that receives an input signal (os2) and provides the rowclk signal as an output signal.

In various implementations, the rising edge of the wordline (WL) pulse may be governed by access time while the trailing edge may be governed by the write cycle. The WLM architecture 504 shown in FIG. 5 may be used to turn-off the wordline (WL) pulse early during a read cycle, e.g., after the sense amplifier enable signal (SAEN) arrives and the read select signal (NYR) rises, while delaying the rise of the wordline during the write cycle after the bitline falls. This early wordline turn-off feature may increase the overall precharge time window when compared to conventional memory designs and may also improve the race ratio margin between bitline precharge and wordline rise.

Also, in some implementations, in reference to FIGS. 4-5, during the first pulse associated with the read cycle, the early reset signal (E_Rst) may fall and then reset the wordline before the timing pulse (RWC_Inv) has fallen. Further, during the second pulse associated with the write cycle, the wordline is delayed as the timing pulse (RWC_Inv) is mixed with the bank signal (PreDec), which may be used to generate the rowclk signal (by way of using the os1 signal to generate rowclk) and then generates WL.

Figure 6:
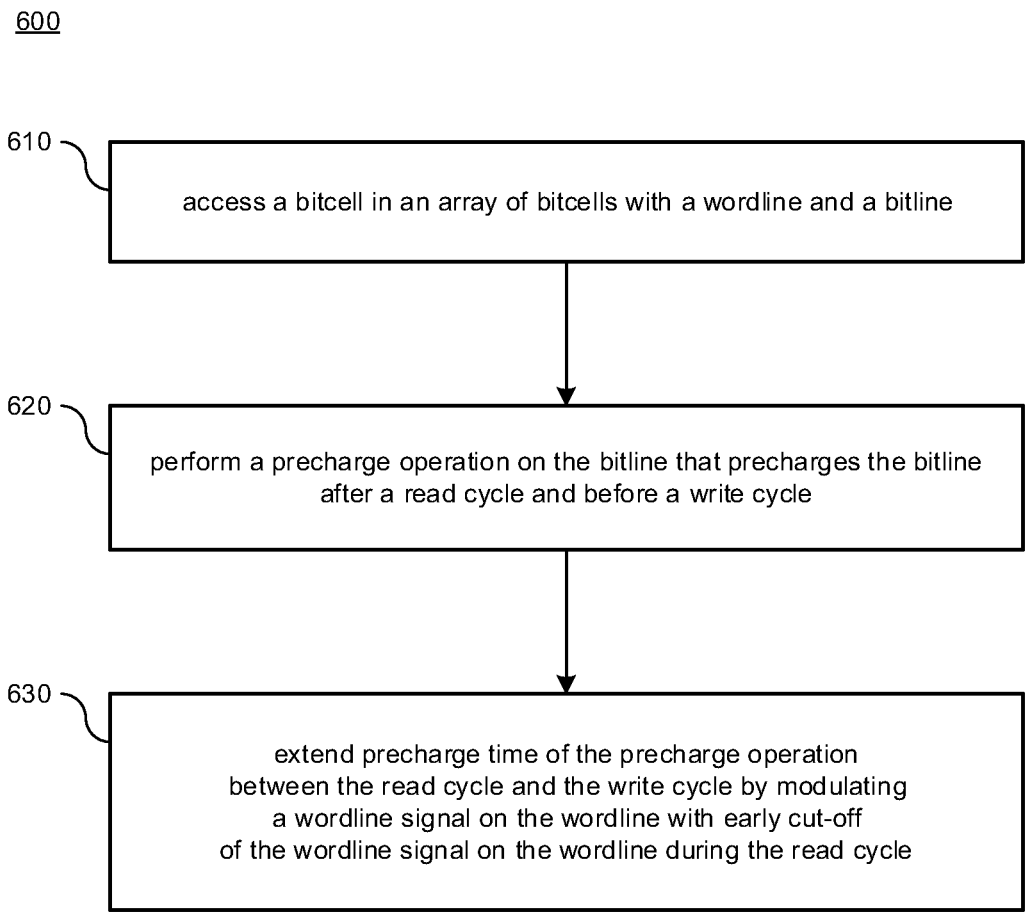

FIG. 6 illustrates a diagram of a method 600 of providing memory architecture in accordance with various implementations described herein.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5. Also, if implemented in software, the method 600 may be implemented as a program and/or software instruction process configured for providing wordline modulating schemes and techniques, as described herein. Also, if implemented in software, various instructions associated with implementing method 600 may be stored in memory and/or a database. For instance, various types of computing devices having a processor and memory may be configured to perform method 600.

In various implementations, method 600 may refer to a method of designing, providing, building, fabricating and/or manufacturing an integrated circuit (IC) device that may involve various wordline modulating schemes and techniques described herein using various components and materials described herein. The IC device may be integrated in various computing circuitry and related components on a single chip, and further, the IC device may be implemented in embedded systems for various electronic, mobile and/or Internet-of-things (IoT) applications, including remote sensor nodes.

At block 610, method 600 may be used to access a bitcell in an array of bitcells with a wordline and a bitline. Also, at block 620, method 600 may be used to perform a precharge operation on the bitline that precharges the bitline after a read cycle and before a write cycle. Moreover, at block 630, method 600 may be used to extend precharge time of the precharge operation between the read cycle and the write cycle by modulating a wordline signal on the wordline with early cut-off of the wordline signal on the wordline during the read cycle.

In some implementations, extending precharge time may increase precharge time during a precharge cycle that occurs between the read cycle and the write cycle so as to thereby enhance performance of accessing the bitcell during an overall operational time duration of the read cycle followed by the precharge cycle and the write cycle which reduces separation time. Also, in other implementations, extending the precharge time of the precharge operation may provide for early precharge of the bitline after the read cycle and before the write cycle.

In some implementations, method 600 may be used to perform a read operation before the precharge cycle and perform the read operation during the read cycle. Also, method 600 may perform a write operation after the precharge cycle and perform the write operation during the write cycle. The write operation may be power-gated by pull-down of the bitline to ground (Vss/Gnd) during the write cycle so as to delay the wordline signal on the wordline. The early cut-off of the wordline signal on the wordline during the read cycle along with the delay of the wordline signal on the wordline assists with extending the precharge time of the precharge operation so as to precharge the bitline faster and within a shorter duration. Moreover, the bitcell refers to a six-transistor (6T) static random access memory (SRAM) bitcell.

FIG. 7 illustrates a diagram of a method 700 of providing memory architecture in accordance with various implementations described herein.

It should be understood that even though the method 700 indicates a particular order of operation execution, in some cases, various particular portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various components and/or circuitry, as described herein in reference to FIGS. 1-6. Also, if implemented in software, the method 400 may be implemented as a program and/or software instruction process configured for providing wordline modulating schemes and techniques, as described herein. Also, if implemented in software, various instructions associated with implementing method 700 may be stored in memory and/or a database. For instance, various types of computing devices having a processor and memory may be configured to perform method 700.

In various implementations, method 600 may refer to a method of designing, providing, building, fabricating and/or manufacturing an integrated circuit (IC) device that may involve various wordline modulating schemes and techniques described herein using various components and materials described herein. The IC device may be integrated in various computing circuitry and related components on a single chip, and further, the IC device may be implemented in embedded systems for various electronic, mobile and/or Internet-of-things (IoT) applications, including remote sensor nodes.

At block 710, method 700 may be used to provide first circuitry that is configured to access a bitcell in an array of bitcells with a wordline and a bitline. At block 720, method 700 may be used to provide second circuitry that is configured to perform a precharge operation on the bitline that precharges the bitline after a read cycle and before a write cycle. At block 730, method 700 may be used to provide third circuitry that is configured to extend precharge time of the precharge operation between the read cycle and the write cycle by modulating a wordline signal on the wordline with early cut-off of the wordline signal on the wordline during the read cycle.

In some implementations, extending precharge time may increase precharge time during a precharge cycle that occurs between the read cycle and the write cycle so as to thereby enhance performance of accessing the bitcell during an overall operational time duration of the read cycle followed by the precharge cycle and the write cycle which reduces separation time. In other implementations, extending the precharge time of the precharge operation may provide for early precharge of the bitline after the read cycle and/or before the write cycle.

In some implementations, method 700 may perform a read operation before the precharge cycle and perform the read operation during the read cycle. Also, method 700 may perform a write operation after the precharge cycle and perform the write operation during the write cycle. The write operation may be power-gated by pull-down of the bitline to ground (Vss/Gnd) during the write cycle so as to thereby delay the wordline signal on the wordline. Also, the early cut-off of the wordline signal on the wordline during the read cycle along with the delay of the wordline signal on the wordline may assist with extending the precharge time of the precharge operation so as to precharge the bitline faster and within a shorter duration. Moreover, the bitcell refers to a six-transistor (6T) static random access memory (SRAM) bitcell.

Advantageously, the various schemes and techniques described herein above may provide for timing improvements, and the design offers lower power as the wordline is pulled-in for the read operation and extra discharge of the bitline is reduced. The design also improves lower power for the write operation as the world in rise is pushed-out and discharge of the half-selected bitlines is reduced. Moreover, in some implementations, the design may improve frequency and also improve performance.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a method that may access a bitcell in an array of bitcells with a wordline and a bitline. The method may perform a precharge operation on the bitline that precharges the bitline after a read cycle and before a write cycle. The method may extend precharge time of the precharge operation between the read cycle and the write cycle by modulating a wordline signal on the wordline with early cut-off of the wordline signal on the wordline during the read cycle.

Described herein are implementations of a device having a wordline driver that accesses a bitcell with a wordline and a bitline. The device may include an input-output circuit that performs a precharge operation on the bitline to precharge the bitline after a read cycle and before a write cycle. The device may include a wordline modulator that extends precharge time of the precharge operation between the read cycle and the write cycle by modulating a wordline signal on the wordline with early cut-off of the wordline signal on the wordline during the read cycle.

Described herein are implementations of a method. The method may provide first circuitry that is configured to access a bitcell in an array of bitcells with a wordline and a bitline. The method may provide second circuitry that is configured to perform a precharge operation on the bitline that precharges the bitline after a read cycle and before a write cycle Also, the method may provide third circuitry that is configured to extend precharge time of the precharge operation between the read cycle and the write cycle by modulating a wordline signal on the wordline with early cut-off of the wordline signal on the wordline during the read cycle.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A method comprising:
   accessing a bitcell in an array of bitcells with a wordline and a bitline;
   performing a precharge operation on the bitline with a bitline precharge signal that precharges the bitline after a read cycle and before a write cycle; and
   extending precharge time of the precharge operation between the read cycle and the write cycle by modulating a wordline signal on the wordline with early cut-off of the wordline signal on the wordline during the read cycle,
   wherein modulating the wordline signal is based on an early reset signal having a falling edge at a beginning of the early reset signal that triggers a falling edge of the wordline signal during the read cycle, and
   wherein the falling edge of the wordline signal triggers a falling edge of the bitline precharge signal.

2. The method of claim 1, wherein:
   extending the precharge time increases the precharge time during a precharge cycle that occurs between the read cycle and the write cycle so as to thereby enhance performance of accessing the bitcell during an overall operational time duration of the read cycle followed by the precharge cycle and the write cycle which reduces separation time.

3. The method of claim 1, further comprising:
   performing a read operation before the precharge cycle; and
   performing the read operation during the read cycle.

4. The method of claim 1, further comprising:
   performing a write operation after the precharge cycle; and
   performing the write operation during the write cycle.

5. The method of claim 4, wherein:
   the write operation is power-gated by pull-down of the bitline to ground during the write cycle so as to delay the wordline signal on the wordline.

6. The method of claim 5, wherein:
   the early cut-off of the wordline signal on the wordline during the read cycle along with the delay of the wordline signal on the wordline assists with extending the precharge time of the precharge operation so as to precharge the bitline faster and within a shorter duration.

7. The method of claim 1, wherein the bitcell refers to a six-transistor (6T) static random access memory (SRAM) bitcell.

8. A method comprising:
   accessing a bitcell in an array of bitcells with a wordline and a bitline;

performing a precharge operation on the bitline with a bitline precharge signal that precharges the bitline after a read cycle and before a write cycle; and extending precharge time of the precharge operation between the read cycle and the write cycle by modulating a wordline signal on the wordline with early cut-off of the wordline signal on the wordline during the read cycle, wherein modulating the wordline signal is based on an early reset signal and a delayed clock signal, wherein extending the precharge time of the precharge operation provides for early precharge of the bitline after the read cycle and before the write cycle, wherein a falling edge at a beginning of the early reset signal triggers a falling edge of the wordline signal during the read cycle, wherein the falling edge of the wordline signal triggers a falling edge of the bitline precharge signal, and wherein a rising edge of the delayed clock signal triggers a rising edge of the wordline signal during the write cycle.

9. A device comprising:

a wordline driver that accesses a bitcell with a wordline and a bitline;

an input-output circuit that performs a precharge operation on the bitline with use of a bitline precharge signal to precharge the bitline after a read cycle and before a write cycle; and a wordline modulator that extends precharge time of the precharge operation between the read cycle and the write cycle by modulating a wordline signal on the wordline with early cut-off of the wordline signal on the wordline during the read cycle, wherein the wordline modulator modulates the wordline signal based on an early reset signal having a falling edge at a beginning of the early reset signal that directly triggers a falling edge of the wordline signal during the read cycle, and wherein the falling edge of the wordline signal triggers a falling edge of the bitline precharge signal.

10. The device of claim 9, wherein:

the wordline modulator extends the precharge time by increasing the precharge time during a precharge cycle that occurs between the read cycle and the write cycle so as to thereby enhance performance of accessing the bitcell during an overall operational time duration of the read cycle followed by the precharge cycle and the write cycle which reduces separation time.

11. The device of claim 9, wherein:

the wordline modulator extends the precharge time of the precharge operation by providing for early precharge of the bitline after the read cycle and before the write cycle.

12. The device of claim 9, wherein the input-output circuit performs:

a read operation before the precharge cycle and during the read cycle; and a write operation after the precharge cycle and during the write cycle.

13. The device of claim 12, wherein:

the write operation is power-gated by pull-down of the bitline to ground during the write cycle so as to delay the wordline signal on the wordline, and the early cut-off of the wordline signal on the wordline during the read cycle along with the delay of the wordline signal on the wordline assists with extending the precharge time of the precharge operation so as to precharge the bitline faster and within a shorter duration.

14. The device of claim 9, wherein the bitcell refers to a six-transistor (6T) static random access memory (SRAM) bitcell.

15. A method comprising:

providing first circuitry that is configured to access a bitcell in an array of bitcells with a wordline and a bitline;

providing second circuitry that is configured to perform a precharge operation on the bitline with a bitline precharge signal that precharges the bitline after a read cycle and before a write cycle; and providing third circuitry that is configured to extend precharge time of the precharge operation between the read cycle and the write cycle by modulating a wordline signal on the wordline with early cut-off of the wordline signal on the wordline during the read cycle, wherein modulating the wordline signal is based on an early reset signal having a falling edge at a beginning of the early reset signal that triggers a falling edge of the wordline signal during the read cycle, and wherein the falling edge of the wordline signal triggers a falling edge of the bitline precharge signal.

16. The method of claim 15, wherein:

extending the precharge time increases the precharge time during a precharge cycle that occurs between the read cycle and the write cycle so as to thereby enhance performance of accessing the bitcell during an overall operational time duration of the read cycle followed by the precharge cycle and the write cycle which reduces separation time.

17. The method of claim 15, wherein:

extending precharge time of the precharge operation provides for early precharge of the bitline after the read cycle and before the write cycle.

18. The method of claim 15, further comprising:

performing a read operation before the precharge cycle;

performing the read operation during the read cycle;

performing a write operation after the precharge cycle; and performing the write operation during the write cycle.

19. The method of claim 18, wherein:

the write operation is power-gated by pull-down of the bitline to ground during the write cycle so as to delay the wordline signal on the wordline, and the early cut-off of the wordline signal on the wordline during the read cycle along with the delay of the wordline signal on the wordline assists with extending the precharge time of the precharge operation so as to precharge the bitline faster and within a shorter duration.

20. The method of claim 15, wherein the bitcell refers to a six-transistor (6T) static random access memory (SRAM) bitcell.

* * * * *